(12) United States Patent
Yoshizaki

(10) Patent No.: US 9,390,938 B2
(45) Date of Patent: Jul. 12, 2016

(54) POLISHING COMPOSITION

(71) Applicant: FUJIMI INCORPORATED, Kiyosu-shi, Aichi (JP)

(72) Inventor: Yukinobu Yoshizaki, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 15/018,327

(22) Filed: Feb. 8, 2016

(65) Prior Publication Data

US 2016/0153095 A1 Jun. 2, 2016

Related U.S. Application Data

(62) Division of application No. 14/426,124, filed as application No. PCT/JP2013/072462 on Aug. 22, 2013.

(30) Foreign Application Priority Data

Sep. 6, 2012 (JP) .................................. 2012-196226

(51) Int. Cl.
*C09K 13/04* (2006.01)
*H01L 21/321* (2006.01)
*H01L 21/306* (2006.01)

(52) U.S. Cl.
CPC ...... *H01L 21/3212* (2013.01); *H01L 21/30625* (2013.01)

(58) Field of Classification Search
CPC ..................... H01L 21/3212; H01L 21/30625
USPC ....................................................... 252/79.2
See application file for complete search history.

(56) References Cited

U.S. PATENT DOCUMENTS

| 5,958,288 | A | 9/1999 | Mueller et al. |
| 7,186,653 | B2 | 3/2007 | Jha et al. |
| 7,553,430 | B2 | 6/2009 | Chandra et al. |
| 2005/0022456 | A1 | 2/2005 | Babu et al. |
| 2005/0026444 | A1 | 2/2005 | Babu et al. |
| 2007/0043230 | A1 | 2/2007 | Jha et al. |
| 2009/0001339 | A1 | 1/2009 | Lee et al. |
| 2012/0001118 | A1 | 1/2012 | Koo et al. |
| 2012/0024818 | A1* | 2/2012 | Ono .................. B24B 37/044 216/53 |
| 2014/0251950 | A1 | 9/2014 | Yoshizki et al. |

FOREIGN PATENT DOCUMENTS

| JP | 2000-034470 | A | 2/2000 |
| JP | 2004-189894 | A | 7/2004 |
| JP | 2004-263074 | A | 9/2004 |
| JP | 2004-363228 | A | 12/2004 |
| JP | 2005-116778 | A | 4/2005 |
| JP | 3822339 | B2 | 9/2006 |
| JP | 2008-527728 | A | 7/2008 |
| JP | 2009-016821 | A | 1/2009 |
| JP | 2012-015520 | A | 1/2012 |
| WO | WO 2013/047734 | A1 | 4/2013 |

OTHER PUBLICATIONS

Japanese Office Action (with English Translation) issued in Japanese Application No. 2012-196226 dated Feb. 9, 2016.
US Office Action on U.S. Appl. No. 14/426,124 dated May 26, 2016.

* cited by examiner

*Primary Examiner* — Roberts Culbert
(74) *Attorney, Agent, or Firm* — Foley & Lardner LLP

(57) ABSTRACT

To provide a means by which polishing rate can further be improved in a polishing composition to be used for an application of polishing an object to be polished containing a metal element or a semimetal element. Oxo acid containing a metal element or a semimetal element, and water are contained in a polishing composition to be used for an application of polishing an object to be polished containing a metal element or a semimetal element.

9 Claims, No Drawings

POLISHING COMPOSITION

CROSS-REFERENCE TO RELATED APPLICATIONS

The present application is a divisional of U.S. application Ser. No. 14/426,124, filed Mar. 4, 2015, which is a National Stage Application of PCT/JP2013/072462, filed Aug. 22, 2013, which claims the benefit of priority from Japanese Patent Application No. 2012-196226, filed Sep. 6, 2012; the entire contents of all of which are incorporated herein by reference.

TECHNICAL FIELD

The present invention relates to a polishing composition. Further, the present invention relates to a polishing method and a method for producing a substrate using the polishing composition.

BACKGROUND ART

In recent years, new fine processing techniques have been developed along with high integration and high performance of LSI. A chemical mechanical polishing (hereinafter, also abbreviated as "CMP") method is one of the methods, and is a technique frequently used in an LSI production process, in particular, in a multilayer wiring forming process.

One of the cases in which this CMP method is applied is polishing of an object to be polished containing a phase change alloy. The phase change alloy is an alloy being one of the phase change materials that reversibly change the phase between an amorphous phase and a crystal phase, and typically includes a germanium-antimony-tellurium alloy (GST alloy), indium antimonide (InSb), and the like. These phase change alloys are used as a structural material of a phase change device such as a phase change random access memory (PCRAM or PCRAM), utilizing the characteristics of the phase change material.

Herein, the phase change alloy greatly differs from other metal materials in the physical properties of being softer and the like as compared with the other metal materials such as copper, and tungsten. Therefore, even when the polishing composition that is used in a conventional CMP method is used as it is in the polishing of a phase change alloy, a satisfactory result may not be obtained. In particular, a practically sufficient polishing rate is difficult to be obtained.

Conventionally, as a technique to improve the polishing rate in the polishing of a phase change alloy, there is a technique described in Patent Literature 1. In Patent Literature 1, into a slurry composition for CMP for a phase change memory device, deionized water and a nitrogen compound such as triethylamine are contained, so that the improvement in the polishing rate to a phase change material layer composed of a GST alloy and the like is attained.

As one of the other cases in which the CMP method is applied, there is a process of forming a wiring structure in an insulator layer. In the process of forming a wiring structure using a CMP method, first, a metal layer composed of tungsten and the like is formed on an insulator layer (for example, a $SiO_2$ layer) on which a recess is formed, so that at least the recess is completely buried. Next, the metal layer is polished and removed by the CMP method until the insulator layer is exposed except for the part of the recess, so that a wiring part is formed in the recess.

Conventionally, as a technique to improve the polishing rate in the polishing of a metal layer, there is a technique described in Patent Literature 2. In Patent Literature 2, a catalyst having multiple oxidation states (for example, ferric nitrate and the like) is used, so that the improvement in the polishing rate to a metal layer is attained.

CITATION LIST

Patent Literature

Patent Literature 1: JP-A-2009-16821
Patent Literature 2: Japanese Patent No. 3822339

SUMMARY OF INVENTION

According to the investigation by the present inventors, it was found that even when a CMP method is performed using a composition described in Patent Literature 1 or Patent Literature 2, there is a case in which sufficient polishing rate cannot be achieved. In order to improve the throughput, further improvement of the polishing composition used in a CMP method is urgently required.

Accordingly, an object of the present invention is to provide a means by which the polishing rate can further be improved in a polishing composition to be used for an application of polishing an object to be polished containing a metal element or a semimetal element.

The present inventors carried out intensive studies to solve the problem described above. As a result, the present inventors found that the above problem can be solved by using an oxo acid in a polishing composition, and thus have completed the present invention.

That is, one embodiment of the present invention is a polishing composition to be used for an application of polishing an object to be polished comprising a metal element or a semimetal element. The polishing composition is characterised in that it comprises an oxo acid comprising a metal element or a semimetal element; and water.

MODE FOR CARRYING OUT THE INVENTION

As described in the above, one embodiment of the present invention is a polishing composition to be used for an application of polishing an object to be polished containing a metal element or a semimetal element. In addition, the polishing composition is characterized in that it comprises an oxo acid containing a metal element or a semimetal element; and water. According to such a constitution, the polishing rate can be more improved when an object to be polished containing a metal element or a semimetal element is polished, and the high throughput can be realized.

Hereinbelow, first, the constitution of the polishing composition according to the present embodiment will be explained, and then an object to be polished in an application of the polishing composition will be explained.

[Constituent of Polishing Composition]

The polishing composition according to the present embodiment includes an oxo acid containing a metal element or a semimetal element, and water as essential constituents. In addition, the polishing composition according to the present embodiment preferably further contains a non-metallic oxidizing agent and/or a polishing accelerator (such as a complexing agent). In addition, an additive such as abrasive grains, an anticorrosive, and a surfactant may further be contained.

(Oxo Acid)

The polishing composition according to the present embodiment comprises essentially an oxo acid containing a metal element or a semimetal element as the characteristic constituent.

The "oxo acid" is also referred to as oxyacid, or oxygen acid, is an acid in which the hydrogen that can be dissociated as a proton ($H^+$) is bonded to an oxygen atom, and is represented by a general formula of $XO_n(OH)_m$. In the typical oxo acids, there are sulfuric acid ($H_2SO_4$), nitric acid ($HNO_3$), phosphoric acid ($H_3PO_4$), and the like, which are inorganic acids not containing a metal element or a semimetal element. However, the polishing composition according to the present embodiment is characterized in that an oxo acid "containing a metal element or a semimetal element" is contained as the oxo acid.

In the present specification, the "metal element" means an element of which the elementary substance shows metal properties of "having metallic luster, being rich in the malleability and ductility, and having significant conductivity of the electricity and heat", and all of the elements conventionally known as a "metal element" are included in this concept. Further, the "semimetal element" is also referred to as metalloid, and is an element showing the properties between metal and non-metal. The semimetal element does not have strictly unambiguous definition, however, means boron (B), silicon (Si), germanium (Ge), arsenic (As), selenium (Se), antimony (Sb), tellurium (Te), polonium (Po), and astatine (At) in the present specification.

In a preferred embodiment, the metal element or the semimetal element contained in an oxo acid is preferably an element belonging to Groups 3 to 17 in the periodic table of elements, and more preferably the elements as follows: B, Al, Si, Sc, Ti, V, Cr, Mn, Fe, Co, Ni, Cu, Zn, Ga, Ge, As, Se, Y, Zr, Nb, Mo, Ru, Rh, Pd, Ag, Cd, In, Sn, Sb, Te, La, Ce, Pr, Nd, Sm, Eu, Gd, Tb, Dy, Ho, Er, Tm, Yb, Lu, Hf, Ta, W, Re, Os, Ir, Tl, Pb, Bi, Po, At, Ac, Th, Pa, U, Np, and Pu. The metal element contained in an oxo acid is particularly preferably tungsten (W), molybdenum (Mo), vanadium (V), manganese (Mn), copper (Cu), iron (Fe), aluminum (Al), cobalt (Co), tantalum (Ta), tin (Sn), gallium (Ga), indium (In), zinc (Zn), lead (Pb), or niobium (Nb), and most particularly tungsten (W), or molybdenum (Mo). Further, the semimetal element contained in an oxo acid is particularly preferably tellurium (Te), germanium (Ge), antimony (Sb), or silicon (Si), and most particularly tellurium (Te).

Specific examples of the oxo acid containing a metal element or a semimetal element are not particularly limited, and include, for example, an oxo acid containing the metal element or semimetal element described above. More specific examples include, for example, telluric acid ($Te(OH)_6$), tungstic acid ($H_2WO_4$ ($WO_3.H_2O$), $H_4WO_5(WO_3.2H_2O)$), molybdic acid ($MoO_3.H_2O$), tungstosilicic acid ($H_4[SiW_{12}O_{40}]$), phosphotungstic acid ($H_3[PW_{12}O_{40}]$), metavanadic acid ($HVC_3$), permanganic acid, aluminic acid, stannic acid, germanic acid, and silicic acid. In addition, various polyacids in which the central atom or metal atom of a polyacid such as the tungstosilicic acid and phosphotungstic acid described above is substituted by another atom may be used as the oxo acid in the present embodiment. Two or more kinds of oxo acids may be used in combination.

In the present specification, the concept of the "oxo acid" also includes a form of a salt or a hydrate. The salt of the oxo acid is a salt of an anion having a structure in which a proton ($H^+$) is dissociated from the oxo acid described above, and an appropriate cation. Examples of the cation constituting the salt of an oxo acid include, for example, a cation of an alkali metal such as sodium, and potassium, or of an alkaline earth metal such as calcium; an ammonium ion ($NH_4^+$); and a cation of a primary amine, a secondary amine, a tertiary amine, or a quaternary amine. In addition, the number of water molecules hydrating an oxo acid in the hydrate of oxo acid is not particularly limited, and conventionally known knowledge can be appropriately referred. Further, in a case where the polishing composition comprises a solvent such as water, the oxo acid (salt) is usually present in a form of an ion such as an anion. Even in such a case, there is no change in that the "polishing composition contains an oxo acid".

The lower limit of the content of the oxo acid in the polishing composition according to the present embodiment is not particularly limited because the oxo acid exerts an effect even in a small amount, however, is preferably 0.0001% by mass or more, more preferably 0.0005% by mass or more, and particularly preferably 0.001% by mass or more, relative to the total amount of 100% by mass of the composition. Further, the upper limit of the content of the oxo acid in the polishing composition according to the present embodiment is not also particularly limited, however, from the viewpoint of the manufacturing cost and the persistence to the object to be polished due to the solubility, is preferably 15% by mass or less, more preferably 10% by mass or less, and particularly preferably 5% by mass or less, relative to the total amount of 100% by mass of the composition.

(Water)

The polishing composition according to the present embodiment comprises essentially water as a dispersion medium or a solvent to disperse or dissolve each component. From the viewpoint of suppressing the inhibition of the action of other components, water which does not contain impurities as much as possible is preferable, specifically, pure water or ultrapure water, in which impurity ions are removed by an ion exchange resin and then foreign matters are removed through a filter, or distilled water is preferable.

In the preferred embodiment of the content of the water in the polishing composition according to the present embodiment, the content of the water is calculated as the balance of the preferable content described for each constituent other than the water in the present specification.

(Non-Metallic Oxidizing Agent)

The polishing composition according to the present embodiment may contain a non-metallic oxidizing agent as an optional component. The "non-metallic oxidizing agent" in the present specification means a compound not containing a metal element, and capable of functioning as an oxidizing agent to an elementary substance of the metal element or the semimetal element contained in an object to be polished. Therefore, the "non-metallic oxidizing agent" can be selected in accordance with the criterion whether or not the non-metallic oxidizing agent has a sufficient oxidation-reduction potential to exert such a function. Therefore, the extension of the "non-metallic oxidizing agent" is not necessarily unambiguously clearly determined, however, examples of the non-metallic oxidizing agent include, for example, hydrogen peroxide, nitric acid, persulfuric acid, chlorous acid, hypochlorous acid, hydrogen oxide, and an adduct thereof, for example, an urea-hydrogen peroxide and a carbonate, an organic peroxide, for example, benzoyl, peracetic acid, and di-t-butyl, sulfite ($SO_5$), sulfite ($S_5O_8$), and sodium peroxide. Examples of the non-metallic oxidizing agent further include periodic acid, iodous acid, hypoiodous acid, iodic acid, perbromic acid, bromous acid, hypobromous acid, bromic acid, perchloric acid, chloric acid, perchloric acid, perboric acid, and a salt of each of the above.

In a case where the polishing composition according to the present embodiment contains a non-metallic oxidizing agent, the lower limit of the content of the non-metallic oxidizing agent in the polishing composition is preferably 0.1% by mass or more, and more preferably 0.3% by mass or more, relative to the total amount of 100% by mass of the composition. As the content of the non-metallic oxidizing agent increases, the polishing rate of the polishing composition to an object to be polished tends to be improved. On the other hand, in a case where the polishing composition according to the present embodiment contains a non-metallic oxidizing agent, the upper limit of the content of the non-metallic oxidizing agent in the polishing composition is preferably 10% by mass or less, and more preferably 5% by mass or less, relative to the total amount of 100% by mass of the composition. As the content of the non-metallic oxidizing agent decreases, the material cost of the polishing composition can be suppressed, and further the load of the treatment of the polishing composition after polishing, that is, waste liquid treatment can be reduced. In addition, an advantageous effect in which excessive oxidation of an object to be polished by the non-metallic oxidizing agent can be prevented can also be obtained.

(Polishing Accelerator)

The polishing composition according to the present embodiment may contain a polishing accelerator as an optional component. The polishing accelerator forms a complex on the surface of an object to be polished to bond to the object to be polished, forms an insoluble brittle film on the surface of the object to be polished, and thus serves to improve the polishing rate of the polishing composition to the object to be polished. Specific examples of the polishing accelerator include a nitrogen compound, a carboxylic acid compound, a phosphorus-containing compound, and a sulfonic acid compound.

Specific examples of the nitrogen compound include an amine, and an ammonium compound. Among them, an ammonium compound is preferable.

The amine may be an aliphatic amine, or may be an aromatic amine. Further, the amine may be a substituted amine, or may be an unsubstituted amine. The amine is preferably an amine having an alkyl group or an alcohol group. The alcohol group is represented by a chemical formula —ROH, in which R represents a hydrocarbon group. Specific examples of the alkyl group include a methyl group, an ethyl group, a propyl group, an isopropyl group, an n-butyl group, an isobutyl group, a sec-butyl group, a tert-butyl group, a pentyl group, an isopentyl group, a neopentyl group, a hexyl group, a heptyl group, an octyl group, a nonyl group, a decyl group, an undecyl group, a dodecyl group, a 2-ethylhexyl group, a tetradecyl group, an octadecyl group, and an icosyl group. Specific examples of the alcohol group include a group derived from methanol, ethanol, anhydrous ethanol, propanol, isopropanol, n-butanol, sec-butanol tert-butanol, benzyl alcohol, or phenol. Specific examples of the amine to be used include an aliphatic primary amine such as methylamine, ethylamine, propylamine, n-butylamine, sec-butylamine, tert-butylamine, and cyclohexylamine; an aliphatic secondary amine such as dimethylamine, diethylamine, dipropylamine, dibutylamine, diisobutylamine, di-sec-butylamine, and di-tert-butylamine; an aliphatic tertiary amine such as trimethylamine, triethylamine, tripropylamine, and tributylamine; other chain amines such as diethylethanolamine, diethanolamine, and triethanolamine; and a cyclic amine such as pyridine, and piperazine. Two or more kinds of amines may be used in combination.

Specific examples of the ammonium compound include a quaternary ammonium compound such as tetramethylammonium hydroxide, tetraethylammonium hydroxide, and tetrapropylammonium hydroxide; ammonium hydroxide (ammonia water); ammonium; and an ammonium salt. The ammonium is present as ammonium ion in a polishing composition. The ammonium ion particularly easily forms a complex with a phase change alloy. The acid component of an ammonium salt may be an acid derived from an inorganic acid such as hydrochloric acid, nitric acid, phosphoric acid, sulfuric acid, and boric acid. Alternatively, the acid component may be an acid derived from a fatty acid such as formic acid, acetic acid, and propionic acid; an aromatic carboxylic acid such as benzoic acid, and phthalic acid; other organic acids such as citric acid, oxalic acid, tartaric acid, malic acid, maleic acid, fumaric acid, succinic acid, organic sulfonic acid, and organic phosphonic acid. Two or more kinds of ammonium compounds may be used in combination.

Specific examples of the carboxylic acid compound include a saturated monocarboxylic acid such as acetic acid, lactic acid, propionic acid, butyric acid, glycolic acid, gluconic acid, salicylic acid, isonicotinic acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid, 3,3-dimethylbutanoic acid, heptanoic acid, octanoic acid, nonanoic acid, and decanoic acid; a polyvalent carboxylic acid such as oxalic acid, malonic acid, tartaric acid, maleic acid, and citric acid; and a salt of these carboxylic acids. Among them, a saturated monocarboxylic acid is preferable. The number of carbon atoms of the saturated monocarboxylic acid is preferably 2 to 6 and more preferably 2 to 4. Specific examples of the saturated monocarboxylic acid having 2 to 6 carbon atoms include acetic acid, lactic acid, propionic acid, butyric acid, glycolic acid, gluconic acid, salicylic acid, isonicotinic acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid, and 3,3-dimethylbutanoic acid. These saturated monocarboxylic acids having 2 to 6 carbon atoms particularly easily form a complex with a phase change alloy. Two or more kinds of carboxylic acid compounds may be used in combination.

The phosphorus-containing compound may be an organic phosphorus compound having a carbon-phosphorous bond, or may be an inorganic phosphorous compound. Specific examples of the organic phosphorus compound include a trivalent organic phosphorus compound such as phosphine, phosphine oxide, phosphine sulfide, and diphosphane; a phosphonium salt; phosphonic acid; phosphinic acid; and a salt or derivative thereof. Among them, the phosphonic acid or phosphinic acid is preferable. Specific examples of the phosphonic acid include 2-aminoethylphosphonic acid, 1-hydroxyethylidene-1,1-diphosphonic acid, amino tri(methylene phosphonic acid), ethylenediamine tetra(methylene phosphonic acid), diethylenetriamine penta(methylene phosphonic acid), ethane-1,1,-diphosphonic acid, ethane-1,1,2-triphosphonic acid, ethane-1-hydroxy-1,1-diphosphonic acid, ethane-1-hydroxy-1,1,2-triphosphonic acid, ethane-1, 2-dicarboxy-1,2-diphosphonic acid, methane hydroxy phosphonic acid, 2-phosphonobutane-1,2-dicarboxylic acid, 1-phosphonobutane-2,3,4-tricarboxylic acid, α-methyl phosphonosuccinic acid, and phenylphosphonic acid. These phosphonic acid and phosphinic acid particularly easily form a complex with a phase change alloy. Two or more kinds of organic phosphorus compounds may be used in combination.

Specific examples of the inorganic phosphorous compound include orthophosphoric acid, hypophosphoric acid, peroxomonophosphoric acid, peroxodiphosphoric acid, polyphosphoric acid (diphosphoric acid, triphosphoric acid, and tetraphosphoric acid), metaphosphoric acid, diamidophosphoric acid, amidophosphoric acid, hexafluorophosphoric acid, hexachlorophosphoric acid, phenylphosphoric acid, apatite, phosphomolybdic acid, phosphotungstic acid, diphosphomolybdic acid, diphosphotungstic acid, ultraphosphoric acid, phosphorus tribromide, phosphorus pentabromide, phosphorus nitride dibromide, phosphorus trichloride, phosphorus pentachloride, diphosphorus tetrachloride, phosphorus fluoride dichloride, phosphorus trifluoride dichloride, phosphorus nitride dichloride, phosphorus trioxide tetrachloride, tetrachloro phosphoric acid, phosphorus tricyanide, phosphorus trifluoride, phosphorus pentafluoride, diphosphorus tetrafluoride, phosphorus triiodide, diphosphorus tetraiodide, phosphorus nitride, phosphorus oxide (phosphorus monoxide, phosphorus dioxide, diphosphorus trioxide, diphosphorus pentoxide, tetraphosphorus hexoxide, and tetraphosphorus decoxide), phosphoryl bromide, phosphoryl chloride, phosphoryl fluoride, phosphoryl nitride, diphosphoryl tetraamide, phosphorus sulfide (diphosphorus pentasulfide, tetraphosphorus trisulfide, tetraphosphorus pentasulfide, and tetraphosphorus heptasulfide), thiophosphoryl bromide, thiophosphoryl chloride, phosphorus hydride, tris(isocyanic acid)phosphorus, tris(isocyanic acid)phosphoryl, tris(isothiocyanic acid)phosphorus, tris(isothiocyanic acid)phosphoryl, phosphorus selenide, diphosphorus triselenide, tetraphosphorus triselenide, diphosphorus pentaselenide, thiophosphoryl fluoride, thiophosphoryl iodide, phosphoryl amide, thiophosphoryl nitride, thiophosphoryl amide, phosphoryl isothiocyanate, phosphorus, phosphide (zinc phosphide, aluminium phosphide, yttrium phosphide, iridium phosphide, potassium phosphide, gallium phosphide, calcium phosphide, osmium phosphide, cadmium phosphide, gold phosphide, indium phosphide, uranium phosphide, chromium phosphide, silicon phosphide, silver phosphide, germanium phosphide, cobalt phosphide, zirconium phosphide, mercury phosphide, scandium phosphide, tin phosphide, thallium phosphide, tungsten phosphide, tantalum phosphide, titanium phosphide, iron phosphide, copper phosphide, thorium phosphide, sodium phosphide, niobium phosphide, nickel phosphide, neptunium phosphide, platinum phosphide, vanadium phosphide, hafnium phosphide, palladium phosphide, barium phosphide, plutonium phosphide, beryllium phosphide, boron phosphide, magnesium phosphide, manganese phosphide, molybdenum phosphide, lanthanum phosphide, lithium phosphide, ruthenium phosphide, rhenium phosphide, and rhodium phosphide), and a salt thereof. Among them, the inorganic phosphorous compound is preferably orthophosphoric acid, hypophosphoric acid, peroxomonophosphoric acid, peroxodiphosphoric acid, polyphosphoric acid (diphosphoric acid, triphosphoric acid, and tetraphosphoric acid), metaphosphoric acid, diamidophosphoric acid, amidophosphoric acid, hexafluorophosphoric acid, hexachlorophosphoric acid, and phenylphosphoric acid, and particularly preferably orthophosphoric acid, or phenylphosphoric acid. These inorganic phosphorous compounds particularly easily form a complex with a phase change alloy. Two or more kinds of inorganic phosphorous compounds may be used in combination.

Specific examples of the sulfonic acid compound include sulfuric acid, alkyl sulfuric acid, allyl sulfuric acid, taurine, isethionic acid, benzenesulfonic acid, and a salt thereof. Among them, benzenesulfonic acid is preferable. The benzenesulfonic acid particularly easily forms a complex with a phase change alloy. Two or more kinds of sulfonic acid compounds may be used in combination.

In the preferred embodiment of the polishing accelerator, there is a complexing agent. In a case where a complexing agent is added into the polishing composition, an advantageous effect in which the polishing rate of the polishing composition to the object to be polished is improved due to the etching action possessed by a complexing agent in addition to the function of the polishing accelerator described above, can be obtained. Further, in the following specific examples, some compounds that overlap with those in the chemical compound group that has already described above as the polishing accelerator are also described, in a case of containing such a compound in the polishing composition, the compound is understood to be contained as a complexing agent.

As the complexing agent, for example, an inorganic acid, an organic acid, an amino acid, a nitrile compound, a chelating agent, and the like can be used. Specific examples of the inorganic acid include sulfuric acid, nitric acid, boric acid, carbonic acid, hypophosphorous acid, phosphorous acid, and phosphoric acid. Specific examples of the organic acid include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid. An organic sulfonic acid such as methanesulfonic acid, ethanesulfonic acid, and isethionic acid can also be used. A salt such as an alkali metal salt of inorganic acid or organic acid may be used in place of the inorganic acid or the organic acid, or in combination with the inorganic acid or the organic acid. Specific examples of the amino acid include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricine, 3,5-diiodo-tyrosine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine, and tryptophan. Among them, glycine, alanine, malic acid, tartaric acid, citric acid, glycolic acid, isethionic acid, or a salt thereof is preferable.

Specific examples of the nitrile compound include, for example, acetonitrile, aminoacetonitrile, propionitrile, butyronitrile, isobutyronitrile, benzonitrile, glutarodinitrile, and methoxyacetonitrile.

Specific examples of the chelating agent include nitrilotriacetic acid, diethylenetriaminepenta-acetic acid, ethylenediaminetetraacetic acid, N,N,N-trimethylene phosphonic acid, ethylenediamine-N,N,N',N'-tetramethylene-sulfonic acid, trans-cyclohexanediaminetetraacetic acid, 1,2-diaiminopropane tetraacetic acid, glycol ether diaminetetraacetic acid, ethylenediamine orthohydroxyphenylacetic acid, ethylenediamine disuccinic acid (SS isomer), N-(2-carboxylate ethyl)-L-aspartic acid, β-alanine diacetic acid, 2-phosphonobutane-1,2,4-tricarboxylic acid, 1-hydroxyethylidene-1,1-diphosphonic acid, N,N'-bis(2-hydroxybenzyl) ethylenediamine-N,N'-diacetic acid, and 1,2-dihydroxybenzene-4,6-disulfonic acid.

In a case where the polishing composition according to the present embodiment contains a polishing accelerator, the lower limit of the content of the polishing accelerator in the polishing composition is preferably 0.001% by mass or more, more preferably 0.01% by mass or more, and furthermore preferably 0.1% by mass or more, relative to the total amount of 100% by mass of the composition. As the content of the polishing accelerator increases, the polishing rate of the polishing composition to an object to be polished is improved. On the other hand, in a case where the polishing composition according to the present embodiment contains a polishing accelerator, the upper limit of the content of the polishing accelerator in the polishing composition is preferably 10% by mass or less, more preferably 8% by mass or less, and furthermore preferably 5% by mass or less, relative to the total amount of 100% by mass of the composition. As the content of the polishing accelerator decreases, the material cost of the polishing composition can be suppressed.

In addition, in a case where a complexing agent is contained as the preferred embodiment of the case where the polishing composition according to the present embodiment contains a polishing accelerator, the lower limit of the content of the complexing agent in the polishing composition is preferably 0.01% by mass or more, and more preferably 0.1% by mass or more, relative to the total amount of 100% by mass of the composition. As the content of the complexing agent increases, the polishing rate of the polishing composition to an object to be polished is improved. On the other hand, from the viewpoint of reducing the risk that the object to be polished easily receives excessive etching by the addition of a complexing agent (preventing excessive etching), the upper limit of the content of the complexing agent in the polishing composition is preferably 10% by mass or less, and more preferably 1% by mass or less, relative to the total amount of 100% by mass of the composition. Further, such an effect of preventing excessive etching is particularly remarkable in a case where the object to be polished contains a semimetal element (for example, in a case of containing a phase change alloy).

(Abrasive Grain)

The polishing composition according to the present embodiment may contain abrasive grains (polishing agent) as an optional component. The abrasive grains serve to mechanically polish the object to be polished. The abrasive grains may be any one of the inorganic particles, organic particles, and organic-inorganic composite particles. Specific examples of the inorganic particles include, for example, particles consisting of a metal oxide such as silica, alumina, ceria, and titania; silicon nitride particles; silicon carbide particles; and boron nitride particles. Specific examples of the organic particles include, for example, polymethyl methacrylate particles. Among them, silica particles are preferable, and colloidal silica is particularly preferable.

The abrasive grain may be surface-modified. In the ordinary colloidal silica, the value of zeta potential is close to zero under an acidic condition, therefore, the silica particles tend to be aggregated without electrically repelling each other under an acidic condition. On the other hand, the abrasive grains that are surface-modified such that the zeta potential has a relatively large positive or negative value even under an acidic condition repel strongly each other even under an acidic condition and are satisfactorily dispersed. As a result, the storage stability of the polishing composition can be improved. Such surface-modified abrasive grains can be obtained, for example, by mixing a metal such as aluminum, titanium, or zirconium, or an oxide thereof with abrasive grains to dope them on the surfaces of the abrasive grains.

Alternatively, the surface-modified abrasive grains in the polishing composition may be silica in which an organic acid is immobilized. Among them, colloidal silica in which an organic acid is immobilized is preferable. The immobilization of organic acid to colloidal silica can be performed by chemically bonding a functional group of the organic acid onto the surface of colloidal silica. The immobilization of organic acid to colloidal silica cannot be achieved only by simply allowing the colloidal silica to coexist with the organic acid. When sulfonic acid that is one kind of organic acids is immobilized to colloidal silica, the immobilization can be performed, for example, by using a method described in "Sulfonic acid-functionalized silica through quantitative oxidation of thiol groups", Chem. Commun. 246-247 (2003). Specifically, a silane coupling agent having a thiol group such as 3-mercaptopropyl trimethoxysilane is coupled with colloidal silica, then the thiol group is oxidized with hydrogen peroxide, and as a result, colloidal silica on the surface of which sulfonic acid has immobilized can be obtained. Alternatively, when carboxylic acid is immobilized to colloidal silica, the immobilization can be performed, for example, by using a method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, a silane coupling agent containing a photoreactive 2-nitrobenzyl ester is coupled with colloidal silica, then the resultant is photoirradiated, and as a result, colloidal silica on the surface of which carboxylic acid has immobilized can be obtained.

The lower limit of the average primary particle diameter of the abrasive grains is preferably 5 nm or more, more preferably 7 nm or more, and furthermore preferably 10 nm or more. Further, the upper limit of the average primary particle diameter of the abrasive grains is preferably 500 nm or less, more preferably 100 nm or less, and furthermore preferably 70 nm or less. As long as the average primary particle diameter is in such a range, the polishing rate of the polishing composition to the object to be polished is improved, and further dishing can be more suppressed from occurring on the surface of the object to be polished after the polishing by using the polishing composition. In addition, as the value of the average primary particle diameter of the abrasive grains, a value calculated based on the specific surface area of the abrasive grains measured by a BET method is employed.

In a case where the polishing composition according to the present embodiment contains abrasive grains, the lower limit of the content of the abrasive grains in the polishing composition is preferably 0.1% by mass or more, more preferably 0.5% by mass or more, and furthermore preferably 1% by mass or more, relative to the total amount of 100% by mass of the composition. As the content of the abrasive grains increases, the polishing rate of the polishing composition to an object to be polished is improved. On the other hand, in a case where the polishing composition according to the present embodiment contains abrasive grains, the upper limit of the content of the abrasive grains in the polishing composition is preferably 20% by mass or less, more preferably 15% by mass or less, and furthermore preferably 10% by mass or less, relative to the total amount of 100% by mass of the composition. As the content of the abrasive grains decreases, the material cost of the polishing composition can be suppressed, and further the aggregation of abrasive grains hardly occurs. In addition, there is also an advantage that a polished surface with few scratches can easily be obtained by the polishing of the object to be polished by using the polishing composition.

(Metal Corrosion Inhibitor)

The polishing composition according to the present embodiment may contain a metal corrosion inhibitor as an optional component. In a case where a metal corrosion inhibitor is added into the polishing composition, an advantageous effect in which surface defects such as dishing on the object to be polished after the polishing by using the polishing composition more hardly occur can be exerted. In addition, in a case where the polishing composition contains the non-metallic oxidizing agent described above, when a metal corrosion inhibitor is contained together with the non-metallic oxidizing agent, the metal corrosion inhibitor serves to reduce the oxidation on the surface of the object to be polished by the non-metallic oxidizing agent, and further to react with a metal ion resulting from the oxidation on the surface of the object to be polished by the non-metallic oxidizing agent to generate an insoluble complex. The function of the metal corrosion inhibitor is to prevent the excessive etching of the polishing composition to the object to be polished. Further, such an effect of preventing excessive etching is particularly remarkable in a case where the object to be polished contains a semimetal element (for example, in a case of containing a phase change alloy).

The kind of the metal corrosion inhibitor to be used is not particularly limited, however, is preferably a heterocyclic compound or a surfactant. The heterocyclic compound or surfactant has high chemical or physical adsorption force to an object to be polished, and forms a strong protective film on the surface of the object to be polished.

In a case where a heterocyclic compound is used as the metal corrosion inhibitor, the number of members in the heterocyclic ring in the heterocyclic compound is not particularly limited. Further, the heterocyclic compound may be a monocyclic compound, or may be a polycyclic compound having a condensed ring.

Specific examples of the heterocyclic compound usable as the metal corrosion inhibitor include a nitrogen-containing heterocyclic compound such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buterizine compound, a thiazole compound, an isothiazole compound, an oxazole compound, an isoxazole compound, and a furazan compound.

Specific examples of the pyrazole compound include 1H-pyrazole, 4-nitro-3-pyrazolecarboxylic acid, and 3,5-pyrazolecarboxylic acid.

Specific examples of the imidazole compound include imidazole, 1-methyl imidazole, 2-methyl imidazole, 4-methylimidazole, 1,2-dimethylpyrazole, 2-ethyl-4-methylimidazole, 2-isopropylimidazole, benzimidazole, 5,6-dimethylbenzimidazole, 2-aminobenzimidazole, 2-chlorobenzimidazole, and 2-methylbenzimidazole.

Specific examples of the triazole compound include 1,2,3-triazole, 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazole-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-diheptyl-4H-1,2,4-triazole, 5-methyl-1,2,4-triazole-3,4-diamine, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5,6-dimethyl-1H-benzotriazole, and 1-(1",2'-dicarboxyethyl)benzotriazole.

Specific examples of the tetrazole compound include 1H-tetrazole, 5-methyltetrazole, 5-aminotetrazole, and 5-phenyltetrazole.

Specific examples of the indole compound include 1H-indole, 1-methyl-1H-indole, 2-methyl-1H-indole, 3-methyl-1H-indole, 4-methyl-1H-indole, 5-methyl-1H-indole, 6-methyl-1H-indole, and 7-methyl-1H-indole.

Specific examples of the indazole compound include 1 H-indazole, and 5-amino-1H-indazole.

In addition, in a case where a surfactant is used as the metal corrosion inhibitor, the surfactant may be anyone of the anionic surfactant, cationic surfactant, amphoteric surfactant, and nonionic surfactant.

Examples of the anionic surfactant include polyoxyethylene alkyl ether acetic acid, polyoxyethylene alkyl sulfuric acid ester, alkyl sulfuric acid ester, polyoxyethylene alkyl sulfuric acid, alkyl sulfuric acid, alkylbenzene sulfonic acid, alkyl phosphoric acid ester, polyoxyethylene alkyl phosphoric acid ester, polyoxyethylene sulfosuccinic acid, alkylsulfosuccinic acid, alkylnaphthalenesulfonic acid, alkyl diphenyl ether disulfonic acid, and a salt thereof.

Examples of the cationic surfactant include an alkyltrimethylammonium salt, an alkyldimethylammonium salt, an alkylbenzyldimethylammonium salt, and an alkyl amine salt.

Examples of the amphoteric surfactant include alkylbetaine, and alkylamine oxide.

Examples of the nonionic surfactant include polyoxyethylene alkyl ether, polyoxyalkylene alkyl ether, sorbitan fatty acid ester, glycerine fatty acid ester, polyoxyethylene fatty acid ester, polyoxyethylene alkylamine, and alkylalkanolamide.

Among them, the surfactant is preferably polyoxyethylene alkyl ether acetic acid, a polyoxyethylene alkyl ether sulfate, an alkyl ether sulfate, an alkyl benzene sulfonate, and polyoxyethylene alkyl ether. These surfactants have high chemical or physical adsorption force onto the surface of the object to be polished, therefore, a stronger protective film is formed on the surface of the object to be polished. This is advantageous for improving the flatness of the surface of the object to be polished after the polishing by using the polishing composition.

In a case where the polishing composition according to the present embodiment contains a metal corrosion inhibitor, the lower limit of the content of the metal corrosion inhibitor in the polishing composition is preferably 0.001% by mass or more, more preferably 0.01% by mass or more, and furthermore preferably 0.1% by mass or more, relative to the total amount of 100% by mass of the composition. As the content of the metal corrosion inhibitor increases, the excessive etching of the polishing composition to the object to be polished can be more strongly prevented. On the other hand, in a case where the polishing composition according to the present embodiment contains a metal corrosion inhibitor, the upper limit of the content of the metal corrosion inhibitor in the polishing composition is preferably 10% by mass or less, more preferably 5% by mass or less, and furthermore preferably 1% by mass or less, relative to the total amount of 100% by mass of the composition. As the content of the metal corrosion inhibitor decreases, the polishing rate of the polishing composition to an object to be polished is improved.

(Other Constitution)

Specific description is omitted, and the polishing composition according to the present embodiment may further contain other components (for example, a water-soluble polymer, an antiseptic, a fungicide, a metal oxidizing agent, a reducing agent, an organic solvent for dissolving hardly-soluble organic matters, and the like) as an optional component. In addition, the polishing composition according to the present embodiment may be a one-pack type, or may be a multi-pack type including a two-pack type. Further, the polishing composition according to the embodiment described above may be prepared by the dilution of the undiluted solution of the polishing composition with water.

(pH of Polishing Composition)

The pH of the polishing composition is not particularly limited. However, if the pH is 12 or less, to say more precisely, 10 or less, the polishing composition is easily handled. Further, if the pH is 1 or more, to say more precisely, 3 or more, in a case where the polishing composition contains abrasive grains, the dispersibility of the abrasive grains is improved.

A pH adjusting agent may be used in order to adjust the pH of the polishing composition to an intended value. The pH adjusting agent to be used may be any one of the acids and alkalis, and may be any one of the inorganic compounds and organic compounds. Further, the pH adjusting agent may be used alone or in the mixture of two or more kinds thereof. In addition, as the various kinds of additives described above (such as a polishing accelerator), in a case where the one having a pH adjusting function (for example, various kinds of acids and the like) is used, the additive may be used for at least part of the pH adjusting agent.

(Application of Polishing Composition)

The polishing composition according to the embodiment described above is used for an application of polishing an object to be polished containing a metal element or a semimetal element. Hereinafter, the application will be explained in detail.

In the application of the polishing composition according to the embodiment described above, the object to be polished contains a metal element or a semimetal element. Herein, the definitions of the "metal element" and "semimetal element" are as in the above, therefore, the detailed description is omitted herein.

The object to be polished is not particularly limited in the other specific constitutions, as long as containing a metal element or a semimetal element, and can be employed as the object to be polished in the application of the polishing composition according to the present invention.

(Case where Object to be Polished Contains Semimetal Element)

Firstly, as one example in a case where the object to be polished contains a semimetal element, a case where the object to be polished contains a phase change alloy will be explained. That is, inane embodiment of the present invention, the polishing composition according to the embodiment described above is used for an application of polishing an object to be polished containing a phase change alloy, to say more precisely, for an application of producing a phase change device by the polishing of the object to be polished containing a phase change alloy. Specific examples of the phase change alloy include an alloy containing a semimetal element such as germanium (Ge), antimony (Sb), tellurium (Te), or polonium (Po), which is described above, and more specific examples include a GST alloy, and indium antimonide (InSb). In the particularly preferred embodiment, the object to be polished contains a GST alloy.

In a case where the object to be polished contains a semimetal element (a phase change alloy such as a GST alloy), an advantage that the polishing rate is remarkably improved can be obtained by performing the polishing using the polishing composition according to the embodiment described above (see "I. Measurement of polishing rate to phase change alloy film" in Examples described below).

In the embodiment in which the object to be polished contains a phase change alloy, the oxo acid contained in the polishing composition preferably contains a semimetal element. Among them, when the oxo acid contained in the polishing composition contains tellurium that is a semimetal element (when telluric acid is used as the oxo acid), an advantage that the polishing rate to the object to be polished containing a phase change alloy (for example, a GST alloy) is remarkably improved can be obtained. That is, in the embodiment in which the object to be polished contains a semimetal element, the oxo acid contained in the polishing composition and the object to be polished both preferably contain the same semimetal element.

In the embodiment in which the object to be polished contains a semimetal element, the detailed reason of exerting an effect of improving the polishing rate as described above is unknown, however, the following mechanism is estimated. That is, in a case of using a non-metallic oxo acid or a non-metallic oxidizing agent, the oxide film to be formed as a result of oxidization of the surface of the object to be polished is hardly sufficiently thickened, and further the formed oxide film tends to become uneven. On the other hand, it is considered that when the oxo acid containing a metal element or a semimetal element is used, the oxo acid itself can become a core of the oxide film due to the high affinity for the metal element or semimetal element contained in the object to be polished, and further the oxidation reaction proceeds in multiple steps, therefore the oxidation reaction sufficiently proceeds and an oxide film with sufficient thickness is formed, and as a result, an effect of improving the polishing rate is obtained. In addition, the above-described mechanism is due to estimation, the present invention is not limited at all by the mechanism.

(Case where Object to be Polished Contains Metal Element)

Subsequently, as another case where the CMP method using the polishing composition according to the embodiment described above is applied, there is a process of forming a wiring structure in an insulator layer. In the forming process of a wiring structure using a CMP method, at first, a metal layer composed of tungsten and the like is formed on an insulator layer (for example, a $SiO_2$ layer) on which having a recess is formed, so that at least the recess is completely buried. Next, the metal layer is polished and removed until the insulator layer other than the recess part is exposed, so that a wiring part is formed in the recess.

In the present invention, as one example in a case where the object to be polished contains a metal element, there is a case where the metal layer in the process described above contains a metal element. In this case, examples of the metal element constituting the metal layer include, for example, a conductor metal such as tungsten (W), ruthenium (Ru), platinum (Pt), gold (Au), hafnium (Hf), cobalt (Co), and nickel (Ni). In addition, from the viewpoint of improving the electrical conductivity of the wiring part formed from the metal layer, W, Ru, Pt, or Au is preferably used, W, or Ru is particularly preferably used, and W is most preferably used.

Further in a case where the object to be polished contains a metal element (a conductor metal such as tungsten), an advantage that the polishing rate is remarkably improved as in the above can be obtained by performing the polishing using the polishing composition according to the embodiment described above (see "II. Measurement of polishing rate to metal layer" in Examples described below). In addition, also in the embodiment in which the object to be polished contains a metal element, as to the detailed reason of exerting an effect of improving the polishing rate as described above, the same mechanism is estimated as described above in the embodiment in which the object to be polished contains a semimetal element.

Further in the embodiment in which the object to be polished contains a metal element, the oxo acid contained in the polishing composition and the object to be polished both preferably contain the same metal element. Among them, when the oxo acid contained in the polishing composition contains tungsten that is a metal element (when tungstic acid, or phosphotungstic acid, a salt thereof, or the like is used as the oxo acid), an advantage that the polishing rate to the object to be polished containing a metal element (for example, a metal layer composed of tungsten) is remarkably improved can be obtained.

In addition, in the embodiment in which the object to be polished contains a metal element, and the oxo acid contained in the polishing composition contains the same metal element as that in the object to be polished, an effect in which metal contamination caused by the metal element that constitutes a metal layer is decreased is also exerted in addition to the effect of improving the polishing rate. Conventionally, for example, as in the technique described in Patent Literature 2, in a case of constituting the polishing composition using a metal oxide containing a metal element that is different from the metal element constituting the metal layer, the metal element contained in the polishing composition remains on a substrate, and affects the performance of the substrate. As a result, there was a problem that the intended performance cannot be obtained, and the deterioration of the device is caused. On the other hand, the oxo acid containing the same metal element as that in the object to be polished is contained in the polishing composition, and as a result, the generation of the above-described problem caused by the residue of the different kind of metal element can be effectively prevented.

[Production Method of Polishing Composition]

The production method of the polishing composition according to the embodiment described above is not particularly limited, and the polishing composition can be obtained, for example, by the stirring and mixing of the oxo acid containing a metal element or a semimetal element (or a salt or hydrate thereof), and other components as described above as needed in water.

The temperature at the time of mixing the components with each other is not particularly limited, however, is preferably 10 to 40° C., and may be raised by heating in order to increase the rate of the dissolution. Further, the mixing time is not also particularly limited.

[Polishing Method and Production Method of Substrate]

As described above, the polishing composition according to the present invention is suitably used for the polishing of the object to be polished containing a metal element or a semimetal element. Therefore, according to another embodiment of the present invention, a polishing method comprising a step of polishing an object to be polished comprising a metal element or a semimetal element with the polishing composition according to the present invention is provided. In addition, according to furthermore another embodiment of the present invention, a method for producing a substrate, comprising a step of polishing an object to be polished comprising a metal element or a semimetal element by the polishing method according to the present invention, is also provided.

As the polishing device, a common polishing device in which a holder for holding a substrate having the object to be polished, and the like, a motor capable of changing the rotation speed, and the like are installed, and a polishing platen capable of attaching a polishing pad (polishing cloth) is provided can be used.

As the polishing pad, common nonwoven fabric, polyurethane, a porous fluorine resin, and the like can be used without any particular limitation. The polishing pad is preferably provided with grooves so as to store a polishing liquid.

The polishing condition is not also particularly limited, for example, the speed of rotation of the polishing platen is preferably 10 to 500 rpm, and the pressure (polishing pressure) applied to the substrate having an object to be polished is preferably 0.5 to 10 psi. The method of supplying the polishing composition to the polishing pad is not particularly limited, and for example, a method of supplying the composition continuously by a pump and the like is employed. The supply amount is not limited, however, the surface of the polishing pad is preferably always covered with the polishing composition of the present invention.

After the completion of the polishing, the substrate is washed in running water, water droplets adhered onto the substrate are shaken off using a spin dryer and the like and dried, and as a result, a substrate having an intended constitution after the polishing of the object to be polished can be obtained.

Examples

The present invention will be described in more detail by way of the following Examples and Comparative examples. However, the technical scope of the present invention is not limited to only the following Examples.

(Preparation of Polishing Composition of Examples 1 to 22 and Comparative Examples 1 to 15)

With the composition showing in the following Table 1, abrasive grains, an oxo acid (containing a metal element or a semimetal element), and as needed a non-metallic oxidizing agent and a polishing accelerator were stirred and mixed in water (mixing temperature: about 25° C., mixing time: about 10 minutes), and a polishing composition of Examples 1 to 22 and Comparative examples 1 to 15 (not containing an oxo acid) was prepared. Herein, as the abrasive grains, colloidal silica modified by an organic acid (sulfonic acid), which has an average secondary particle diameter of about 70 nm (an average primary particle diameter of 35 nm, and a degree of association of 2), was used. Further, the pH of the composition was adjusted with the addition of potassium hydroxide (KOH), and confirmed by a pH meter.

(I. Measurement of Polishing Rate to Phase Change Alloy Film)

The polishing rate to a phase change alloy film (a GST alloy film) was measured using the polishing composition of Examples 1 to 22 and Comparative examples 1 to 15 obtained in the above, and using a substrate containing a GST alloy film (the mass ratio among germanium, antimony, and tellurium was 2:2:5) that is a phase change alloy film as the object to be polished. The polish rate was determined by the division of the difference in thickness of the wafers before and after the polishing, which were measured using a sheet resistance measuring instrument that is based on a DC 4-probe method, by the polishing time. Further, the polishing conditions were as follows.

[Table 1]
Polishing device: CMP one-side polishing device
Polishing pad: Made of polyurethane
Polishing pressure: 1.8 psi (about 12.42 kPa)
Polishing platen speed: 60 rpm
Adding method of polishing composition: Poured and flowed The measurement results of the polishing rate to a phase change alloy film (GST alloy film) are shown in the following Table 2.

TABLE 2

| | Abrasive grain | Oxo acid | | Non-metallic oxidizing agent | | Polishing accelerator | | | | GST |
|---|---|---|---|---|---|---|---|---|---|---|
| | Content (% by mass) | Kind | Content (% by mass) | Kind | Content (% by mass) | Kind | Content (% by mass) | Concentration (mol/L) | pH | polishing rate (Å/min) |
| Example 1 | 2.5 | Telluric acid | 0.5 | — | — | — | — | — | 3 | 250 |
| Example 2 | 2.5 | Telluric acid | 0.5 | — | — | — | — | — | 7 | 188 |
| Example 3 | 2.5 | Telluric acid | 0.5 | — | — | — | — | — | 10 | 226 |
| Example 4 | 2.5 | Phosphotungstic acid n-hydrate | 0.5 | — | — | — | — | — | 3 | 282 |
| Example 5 | 2.5 | Phosphotungstic acid n-hydrate | 0.5 | — | — | — | — | — | 7 | 301 |
| Example 6 | 2.5 | Phosphotungstic acid n-hydrate | 0.5 | — | — | — | — | — | 10 | 113 |
| Example 7 | 2.5 | Telluric acid | 0.5 | Hydrogen peroxide | 5 | — | — | — | 3 | 802 |
| Example 8 | 2.5 | Telluric acid | 0.5 | Hydrogen peroxide | 5 | — | — | — | 10 | 802 |
| Example 9 | 2.5 | Tungstic acid | 0.5 | Hydrogen peroxide | 5 | — | — | — | 3 | 222 |
| Example 10 | 2.5 | Tungstic acid | 0.5 | Hydrogen peroxide | 5 | — | — | — | 10 | 259 |
| Example 11 | 2.5 | Tungstosilicic acid | 0.5 | Hydrogen peroxide | 5 | — | — | — | 3 | 802 |
| Example 12 | 2.5 | Tungstosilicic acid | 0.5 | Hydrogen peroxide | 5 | — | — | — | 10 | 301 |
| Example 13 | 2.5 | Phosphotungstic acid n-hydrate | 0.5 | Hydrogen peroxide | 5 | — | — | — | 3 | 150 |
| Example 14 | 2.5 | Phosphotungstic acid n-hydrate | 0.5 | Hydrogen peroxide | 5 | — | — | — | 7 | 188 |
| Example 15 | 2.5 | Phosphotungstic acid n-hydrate | 0.5 | Hydrogen peroxide | 5 | — | — | — | 10 | 903 |
| Example 16 | 2.5 | Sodium metavanadate | 0.5 | Hydrogen peroxide | 5 | — | — | — | 3 | 100 |
| Example 17 | 2.5 | Sodium metavanadate | 0.5 | Hydrogen peroxide | 5 | — | — | — | 10 | 401 |
| Example 18 | 2.5 | Molybdic acid | 0.5 | Hydrogen peroxide | 5 | — | — | — | 3 | 108 |
| Example 19 | 2.5 | Molybdic acid | 0.5 | Hydrogen peroxide | 5 | — | — | — | 10 | 401 |
| Example 20 | 5 | Telluric acid | 0.5 | Hydrogen peroxide | 5 | Glycolic acid | 0.76 | 0.1 | 3 | 1354 |
| Example 21 | 5 | Telluric acid | 0.5 | Hydrogen peroxide | 5 | Glycolic acid | 0.76 | 0.1 | 10 | 2256 |
| Example 22 | 5 | Telluric acid | 0.02 | Hydrogen peroxide | 1.25 | Glycolic acid | 0.76 | 0.1 | 10 | 1705 |
| Comparative example 1 | 2.5 | — | — | — | — | — | — | — | 3 | 4 |
| Comparative example 2 | 2.5 | — | — | — | — | — | — | — | 10 | 8 |
| Comparative example 3 | 2.5 | — | — | Hydrogen peroxide | 0.2 | — | — | — | 10 | 16 |
| Comparative example 4 | 2.5 | — | — | Hydrogen peroxide | 0.2 | — | — | — | 3 | 13 |
| Comparative example 5 | 2.5 | — | — | Periodic acid | 1.1 | — | — | — | 10 | 23 |
| Comparative example 6 | 2.5 | — | — | Periodic acid | 1.1 | — | — | — | 3 | 31 |
| Comparative example 7 | 2.5 | — | — | Oxone (*) | 3.1 | — | — | — | 3 | 38 |
| Comparative example 8 | 2.5 | — | — | Hypochlorous acid | 0.5 | — | — | — | 10 | 36 |
| Comparative example 9 | 2.5 | — | — | Hypochlorous acid | 0.5 | — | — | — | 3 | 53 |
| Comparative example 10 | 2.5 | — | — | Sodium hypochlorite | 0.5 | — | — | — | 10 | 28 |
| Comparative example 11 | 2.5 | — | — | Sodium hypochlorite | 0.5 | — | — | — | 3 | 23 |
| Comparative example 12 | 2.5 | — | — | Nitric acid | 0.3 | — | — | — | 10 | 20 |

TABLE 2-continued

| | Abrasive grain Content (% by mass) | Oxo acid Kind | Oxo acid Content (% by mass) | Non-metallic oxidizing agent Kind | Non-metallic oxidizing agent Content (% by mass) | Polishing accelerator Kind | Polishing accelerator Content (% by mass) | Concentration (mol/L) | pH | GST polishing rate (Å/min) |
|---|---|---|---|---|---|---|---|---|---|---|
| Comparative example 13 | 2.5 | — | — | Nitric acid | 0.3 | — | — | — | 3 | 14 |
| Comparative example 14 | 2.5 | — | — | Nitrous acid | 0.2 | — | — | — | 10 | 23 |
| Comparative example 15 | 2.5 | — | — | Nitrous acid | 0.2 | — | — | — | 3 | 17 |

(*) "Oxone" means a sulfate expressed by chemical formula $2KHSO_5 \cdot KHSO_4 \cdot K_2SO_4$.

From the results shown in Table 2, it was found that when the polishing composition according to Examples (containing an oxo acid containing a metal element or a semimetal element) was used, the polishing rate to a GST alloy film was remarkably improved. Further, it was also found that in a case where the one containing a semimetal element as the oxo acid (telluric acid in the above) was used, the effect of improving the polishing rate was more remarkably exerted by using a non-metallic oxidizing agent in combination. In addition, it was shown that the phenomenon was increasingly enhanced in a case where the polishing accelerator (glycolic acid in the above) was further used in combination. Further, it was found that when telluric acid was used as the oxo acid, high polishing rate was exerted regardless of the pH of the composition (Examples 7 to 8). In addition, it was also shown that when tungstosilicic acid was used as the oxo acid, a higher polishing rate was achieved when the pH of the composition was acidic (Examples 11 and 12), on the other hand, when phosphotungstic acid was used as the oxo acid, a higher polishing rate was achieved when the pH of the composition was alkaline (Examples 13 to 15).

(II. Measurement of Polishing Rate to Metal Layer)

The polishing rate to a metal layer (tungsten layer) was measured using a polishing composition of Examples 9, 13, 16, and 18 and Comparative examples 1 to 4, 12, and 13 obtained in the above, and using a tungsten blanket substrate containing a tungsten layer that is a metal layer as the object to be polished. Further, the measurement method of polishing rate and the polishing conditions were the same as those in the above-described "Measurement of polishing rate to phase change alloy film".

The measurement results thus obtained of the polishing rate to a metal layer (tungsten layer) are shown in the following Table 3.

TABLE 3

| | Abrasive grain Content (% by mass) | Oxo acid Kind | Oxo acid Content (% by mass) | Non-metallic oxidizing agent Kind | Non-metallic oxidizing agent Content (% by mass) | Polishing accelerator Kind | Polishing accelerator Content (% by mass) | Concentration (mol/L) | pH | W polishing rate (Å/min) |
|---|---|---|---|---|---|---|---|---|---|---|
| Example 9 | 2.5 | Tungstic acid | 0.5 | Hydrogen peroxide | 5 | — | — | — | 3 | 891 |
| Example 13 | 2.5 | Phosphotungstic acid n-hydrate | 0.5 | Hydrogen peroxide | 5 | — | — | — | 3 | 603 |
| Example 16 | 2.5 | Sodium metavanadate | 0.5 | Hydrogen peroxide | 5 | — | — | — | 3 | 402 |
| Example 18 | 2.5 | Molybdic acid | 0.5 | Hydrogen peroxide | 5 | — | — | — | 3 | 434 |
| Comparative example 1 | 2.5 | — | — | — | — | — | — | — | 3 | 34 |
| Comparative example 2 | 2.5 | — | — | — | — | — | — | — | 10 | 10 |
| Comparative example 3 | 2.5 | — | — | Hydrogen peroxide | 0.2 | — | — | — | 10 | 54 |
| Comparative example 4 | 2.5 | — | — | Hydrogen peroxide | 0.2 | — | — | — | 3 | 124 |
| Comparative example 12 | 2.5 | — | — | Nitric acid | 0.3 | — | — | — | 10 | 14 |
| Comparative example 13 | 2.5 | — | — | Nitric acid | 0.3 | — | — | — | 3 | 23 |

From the results shown in Table 3, it was found that when the polishing composition according to Examples (containing an oxo acid containing a metal element or a semimetal element) was used, the polishing rate to the metal layer (tungsten layer) was remarkably improved. Further, as in Examples 9 and 13, it was also shown that in a case where the oxo acid contained in the polishing composition and the metal layer contained in the object to be polished contain the same metal element (tungsten in the above), the effect of improving the polishing rate is more remarkably exerted.

The invention claimed is:

1. A polishing method, comprising a step of polishing an object to be polished comprising a metal element or a semimetal element with a polishing composition comprising:

an oxo acid comprising a metal element or a semimetal element; and
water,
wherein the oxo acid and the object to be polished comprise the same metal element or semimetal element.

2. A method for producing a substrate, comprising a step of polishing an object to be polished comprising the metal element or a semimetal element by the polishing method set forth in claim 1.

3. The polishing method according to claim 1, wherein the object to be polished comprises a phase change alloy, and
the oxo acid comprises a semimetal element.

4. The polishing method according to claim 3, wherein the phase change alloy is a germanium-antimony-tellurium alloy.

5. The polishing method according to claim 1, wherein the oxo acid in the polishing composition comprises tellurium as the semimetal element.

6. The polishing method according to claim 1, wherein the object to be polished comprises a metal layer comprising the metal element.

7. The polishing method according to claim 6, wherein the metal layer comprises tungsten.

8. The polishing method according to claim 1, wherein the polishing composition further comprises a non-metallic oxidizing agent.

9. The polishing method according to claim 1, wherein the polishing composition further comprises a polishing accelerator.

* * * * *